US007601565B2

(12) United States Patent
Seo et al.

(10) Patent No.: US 7,601,565 B2
(45) Date of Patent: Oct. 13, 2009

(54) THIN FILM TRANSISTOR AND METHOD OF FABRICATING THE SAME

(75) Inventors: Jin-Wook Seo, Suwon-si (KR); Ki-Yong Lee, Suwon-si (KR); Tae-Hoon Yang, Suwon-si (KR); Byoung-Keon Park, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 399 days.

(21) Appl. No.: 11/279,798

(22) Filed: Apr. 14, 2006

(65) Prior Publication Data

US 2006/0183273 A1    Aug. 17, 2006

Related U.S. Application Data

(62) Division of application No. 11/017,667, filed on Dec. 22, 2004.

(30) Foreign Application Priority Data

Jun. 23, 2004    (KR) ................ 2004-47308

(51) Int. Cl.
    *H01L 21/84* (2006.01)
(52) U.S. Cl. ............... 438/149; 438/166; 438/482; 438/486; 257/E21.415
(58) Field of Classification Search ........... 438/149, 438/166, 482, 486, 487; 257/E21.415
    See application file for complete search history.

(56) References Cited

U.S. PATENT DOCUMENTS

| 5,534,716 | A | | 7/1996 | Takemura |
| 6,080,239 | A | * | 6/2000 | Noguchi ............ 117/92 |
| 6,326,248 | B1 | * | 12/2001 | Ohtani et al. ........ 438/151 |
| 6,426,246 | B1 | | 7/2002 | Chang et al. |
| 6,521,909 | B2 | | 2/2003 | Yamaguchi |
| 6,537,890 | B2 | | 3/2003 | Joo et al. |

(Continued)

FOREIGN PATENT DOCUMENTS

JP       07058339       3/1995

(Continued)

OTHER PUBLICATIONS

Chinese Office Action dated Apr. 11, 2008, 10 pages.

(Continued)

*Primary Examiner*—Michael Trinh
(74) *Attorney, Agent, or Firm*—H.C. Park & Associates, PLC

(57) ABSTRACT

A thin film transistor and method of fabricating the same are provided. In the thin film transistor, a seed or a grain boundary exists in a semiconductor layer pattern but not in a junction region. The method includes forming a semiconductor layer pattern. Forming the semiconductor layer pattern includes: forming and patterning a first capping layer on an amorphous silicon layer; forming a second capping layer on the first capping layer pattern; forming a metal catalyst layer on the second capping layer; diffusing the metal catalyst; and crystallizing the amorphous silicon layer to form a polysilicon layer. Therefore, it is possible to prevent that a trap is generated in the junction region, thereby obtaining improved and uniform characteristics of the device.

16 Claims, 7 Drawing Sheets

U.S. PATENT DOCUMENTS

| | | |
|---|---|---|
| 2002/0001868 A1 | 1/2002 | Joo |
| 2004/0110329 A1 | 6/2004 | Joo |

FOREIGN PATENT DOCUMENTS

| | | |
|---|---|---|
| JP | 07335548 | 12/1995 |
| JP | 10107290 | 4/1998 |
| JP | 10199807 | 7/1998 |
| JP | 2000-133807 | 5/2000 |
| JP | 2001057339 | 2/2001 |
| KR | 1020020033373 | 5/2002 |
| KR | 102003006043 A | 7/2003 |
| KR | 1020040040762 | 5/2004 |

OTHER PUBLICATIONS

Japanese Office Action dated Jul. 29, 2008.
Non-Final Office Action dated May 22, 2006 (from copending U.S. Appl. No. 11/017,667).
Final Office Action dated Oct. 19, 2006 (from copending U.S. Appl. No. 11/017,667).
Non-Final Office Action dated Jul. 5, 2007 (from copending U.S. Appl. No. 11/017,667).
Final Office Action dated Dec. 20, 2007 (from copending U.S. Appl. No. 11/017,667).
Notice of Allowance dated Jun. 25, 2008 (from copending U.S. Appl. No. 11/017,667).
Non-Final Office Action mailed May 27, 2009 (from copending U.S. Appl. No. 11/017,667).

* cited by examiner

THIN FILM TRANSISTOR AND METHOD OF FABRICATING THE SAME

CROSS-REFERENCE TO RELATED APPLICATION

This application is a divisional of prior application Ser. No. 11/017,667, filed Dec. 22, 2004, which claims priority to and the benefit of Korean Patent Application No. 2004-47308, filed Jun. 23, 2004, both of which are hereby incorporated herein by reference in their entirety.

BACKGROUND OF THE INVENTION

1. Field of the Invention

The present invention relates to a thin film transistor and method of fabricating the same and, more particularly, to a thin film transistor and method of fabricating the same, in which a seed or a grain boundary does not exist in a junction region.

2. Description of the Related Art

In general, a polysilicon layer has been widely used as a semiconductor layer for thin film transistor since it has high field effect mobility and may be used in a high-speed circuit and a CMOS circuit. The thin film transistor using the polysilicon layer is generally used in an active device of an active matrix liquid crystal display (AMLCD) and switching and driving devices of an organic light emitting diode (OLED).

Here, the polysilicon layer used in the thin film transistor may be fabricated by a direct deposition method, a high-temperature annealing method and a laser annealing method. The laser annealing method may be used in a low-temperature process and implement the high field effect mobility. However, it requires high-cost laser equipment so that a substitute technology has been widely developed.

Currently, a method of crystallizing amorphous silicon using metal has been widely developed since the crystallization is made at a lower temperature and in a shorter time than that of a solid phase crystallization (SPC) method. The metal crystallization method is classified into a metal induced crystallization (MIC) method and a metal induced lateral crystallization (MILC) method. However, even with the metal crystallization method, the characteristics of the thin film transistor device are degraded due to metal contamination.

Meanwhile, in order to reduce the amount of metal and fabricate a high-quality polysilicon layer, there has been developed a method of fabricating a high-quality polysilicon layer through high-temperature processing, rapid thermal annealing or laser illumination by adjusting a concentration of the metal ion using an ion implanter. In addition, in order to planarize the surface of a polysilicon layer using a metal induced crystallization method, a crystallization method of mixing liquid-phase metal and a viscous organic layer, depositing a thin film thereon using a spin coating method, and annealing the resultant has also been developed. However, even with the aforementioned crystallization method, a large-sized grain and grain uniformity, are still problematic, which is critical in the polysilicon layer.

To solve the foregoing problems, a method of fabricating a polysilicon layer through a crystallization method using a cover layer was disclosed in Korean Patent Application No. 2003-0060403. The method includes: depositing an amorphous silicon layer on a substrate; forming a capping layer on the amorphous silicon layer; depositing a metal catalyst layer on the capping layer; diffusing the metal catalyst into the amorphous silicon layer through the capping layer using laser or heat to form a seed; and forming a polysilicon layer using the seed. This method may prevent unnecessary metal contamination since the metal catalyst diffuses through the cover layer.

However, for a thin film transistor fabricated by the aforementioned method, since the region where the seed is formed contains a large amount of crystallization metal catalysts, a lot of traps may be formed. Here, a term "trap" refers to a kind of defect, for example, causing a discontinuous energy band due to existence of a seed or a grain boundary in the semiconductor layer. Therefore, when the traps exist in a junction region, the characteristics of the thin film transistor may be degraded and non-uniform.

SUMMARY OF THE INVENTION

The present invention, therefore, solves aforementioned problems associated with conventional devices by providing a thin film transistor and method of fabricating the same, in which a capping layer is patterned and crystallized such that a seed or a grain boundary is not formed in a junction region to improve the device characteristics of the thin film transistor and obtain the uniform characteristics.

In an exemplary embodiment according to the present invention, a thin film transistor includes: a substrate; a semiconductor layer pattern formed on the substrate; a gate insulating layer formed on the semiconductor layer pattern; and a gate electrode formed on the gate insulating layer, wherein a seed or a grain boundary exists in the semiconductor layer pattern but not in a junction region. Therefore, it is possible to prevent that traps are generated in the junction region, and the device characteristics may be improved and more uniform.

The seed or the grain boundary in the semiconductor layer pattern may exist in an active region of the semiconductor layer pattern.

The junction region may be formed within 1 μm from the junction to a source region or a drain region. The seed may be formed within 1 to 3 μm from the junction region in the direction of a contact hole. In addition, a crystallization ratio of the junction region is preferably 0.7 to 0.9

The thin film transistor may further include a buffer layer interposed between the substrate and the semiconductor layer pattern. The buffer layer may be formed of a silicon nitride layer or a silicon oxide layer.

The thin film transistor may be used in a liquid crystal display or an organic light emitting device.

In another exemplary embodiment according to the present invention, a method of fabricating a thin film transistor includes: forming an amorphous silicon layer on a substrate; crystallizing and patterning the amorphous silicon layer to form a semiconductor layer pattern; forming a gate insulating layer on the semiconductor layer pattern; and forming a gate electrode on the gate insulating layer, wherein a seed or a grain boundary exists in the semiconductor layer pattern but not in a junction region.

The seed or the grain boundary in the semiconductor layer pattern may exist in an active region of the semiconductor layer pattern.

Forming of the semiconductor layer pattern includes: forming and patterning a first capping layer on the amorphous silicon layer; forming a second capping layer on the first capping layer pattern; forming a metal catalyst layer on the second capping layer; diffusing the metal catalyst; and crystallizing the amorphous silicon layer to form a polysilicon layer.

The first capping layer may be patterned such that the seed may be formed within 1 to 3 μm from the junction region in the direction of a contact hole.

The first capping layer pattern and the second capping layer may be formed of silicon nitride layers or silicon oxide layers. Preferably, the first capping layer pattern is thicker or has a higher-density than the second capping layer.

The first capping layer and the second capping layer may be formed by a PECVD method. The metal catalyst is preferably formed of nickel (Ni). The metal catalyst layer may be formed by a CVD method or a sputtering method.

The diffusion of the metal catalyst may be performed by an annealing process. Preferably, the annealing process is performed at a temperature of 200 to 700° C. The amorphous silicon layer may be crystallized by an annealing process. Preferably, the annealing process is performed at a temperature of 400 to 1000° C.

Through annealing, the diffusion of the metal catalyst and the crystallization of the amorphous silicon layer may be performed at the same time.

The method may further include: forming a buffer layer between the substrate and the amorphous silicon layer.

BRIEF DESCRIPTION OF THE DRAWINGS

The above and other features of the present invention will be described in reference to certain exemplary embodiments thereof with reference to the attached drawings in which.

DETAILED DESCRIPTION OF THE INVENTION

Figure 1:
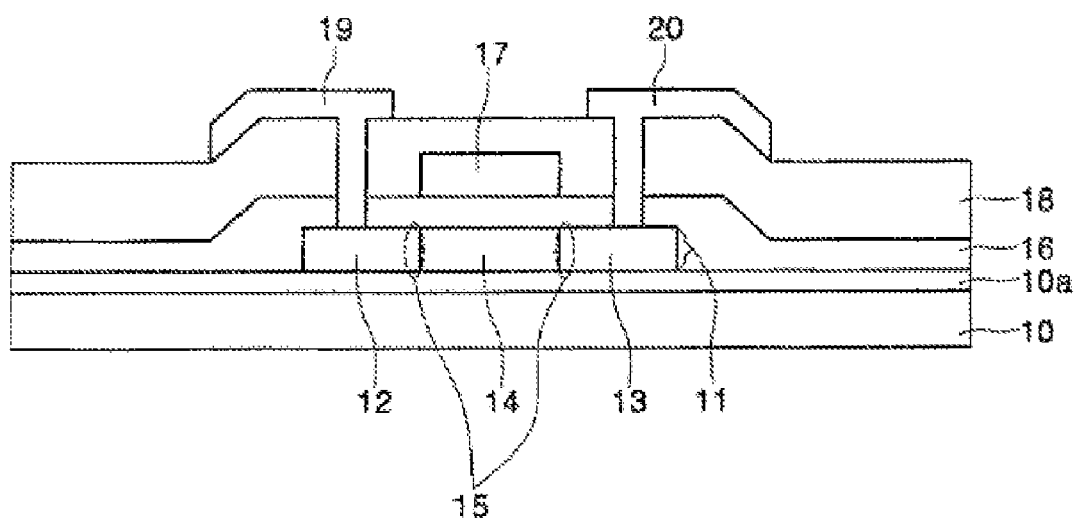
FIG. 1 is a cross-sectional view of a thin film transistor according to a first embodiment of the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

FIG. 1 is a cross-sectional view of a thin film transistor according to a first embodiment of the present invention.

Referring to FIG. 1, a semiconductor layer pattern 11 is formed on a substrate 10. The substrate 10 is preferably an insulating substrate, such as a glass. A buffer layer 10 a may be formed on the substrate 10. The semiconductor layer pattern 11 includes source and drain regions 12 and 13 and a channel layer 14. A seed or a grain boundary exists in the semiconductor layer pattern 11. However, the seed or the grain boundary does not exist in a region where the source and drain regions 12 and 13 and the channel layer 14 are met, i.e., a junction region 15. The seed or the grain boundary in the semiconductor layer pattern may exist in an active region of the semiconductor layer pattern. A term "junction" refers to a place where the source and drain regions and the channel layer are met. The junction region 15 does not necessarily mean a junction where the source and drain region and the channel region are met, but also represents a region affected by an electric field, i.e., within 1 μm toward the source and drain regions other than the channel layer.

There exists a problem that the characteristics of the thin film transistor may be degraded and non-uniform due to generation of traps, which will be described below, in the junction region 15 when the seed exists in the junction region 15. Thus, according to the present invention, the crystallization is adjusted such that the seed is not formed in the junction region 15, by using a first capping layer pattern.

The seed is preferably formed within 1 to 3 μm apart from the junction region 15. When the seed is formed at the above place, a channel layer is formed in a region having a good crystalline ratio within the grains. This will be described in more detail with reference to FIG. 3.

A gate insulating layer 16 is formed on the semiconductor layer pattern 11, and a gate electrode 17 is formed on the gate insulating layer 16. An interlayer insulating layer 18 having contact holes therein is formed on the gate insulating layer 16 and the gate electrode 17. Source and drain electrodes 19 and 20 in contact with the source and drain regions 12 and 13 through the contact holes are formed.

Figure 2:
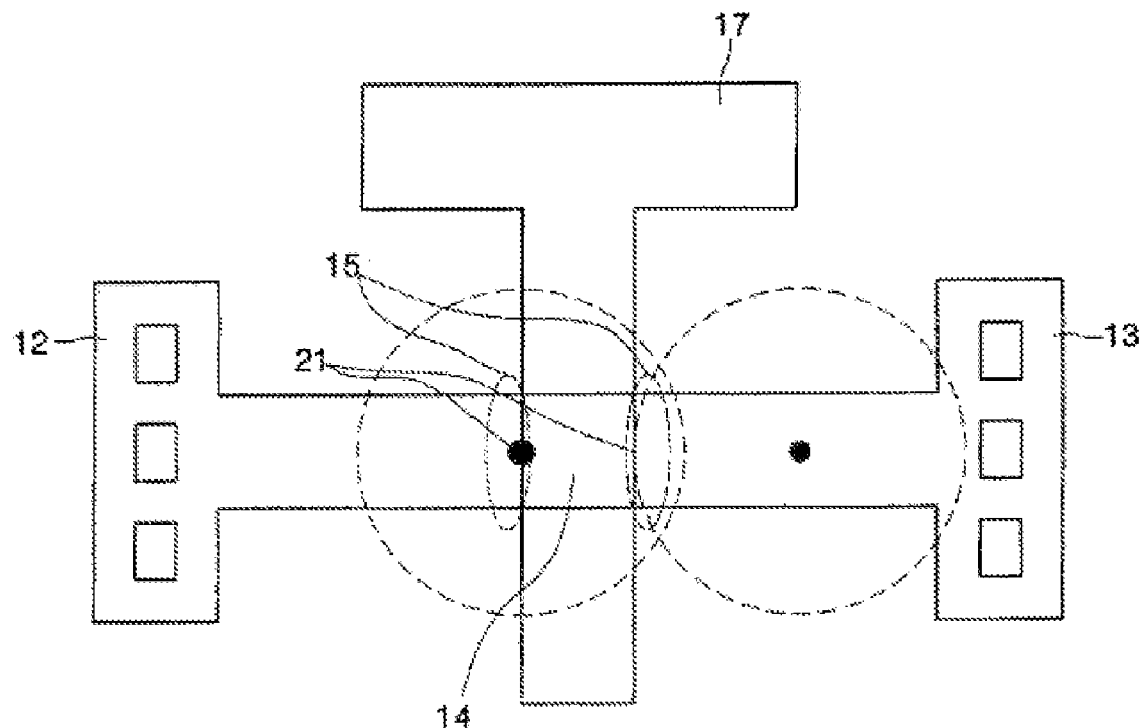
FIG. 2 is a plan view of a thin film transistor in which traps are generated in a junction region.

FIG. 2 is a plan view of a thin film transistor in which traps are generated in a junction region.

Referring to FIG. 2, it will be appreciated that the seed is formed in the junction region 15 and a trap 21 is generated. In addition, it will be appreciated that the grain boundary is formed in the junction region 15 so that another trap 21 is generated. When the traps 21 exist in the junction region 15, a continuous energy band becomes discontinuous, which servers as a defect. Therefore, the device characteristics of the thin film transistor are degraded. According to the present invention, the trap generation may be prevented by adjusting positions of the seed or the grain boundary using the capping layer pattern.

Figure 3A:
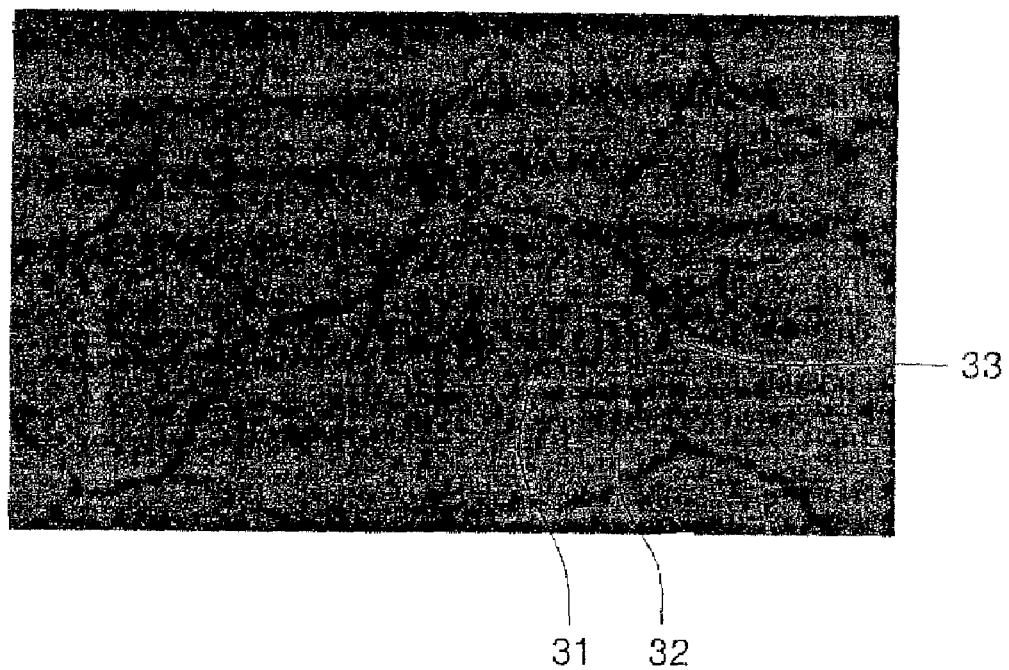
FIG. 3A is a SEM photograph of a completely grown grain.

FIG. 3A is a scanning electron microscopy (SEM) photograph of a completely grown grain, where reference numeral 31 indicates a grain center, 32 indicates a place between the grain center and the grain boundary, and 33 indicates the grain boundary.

Figure 3B:
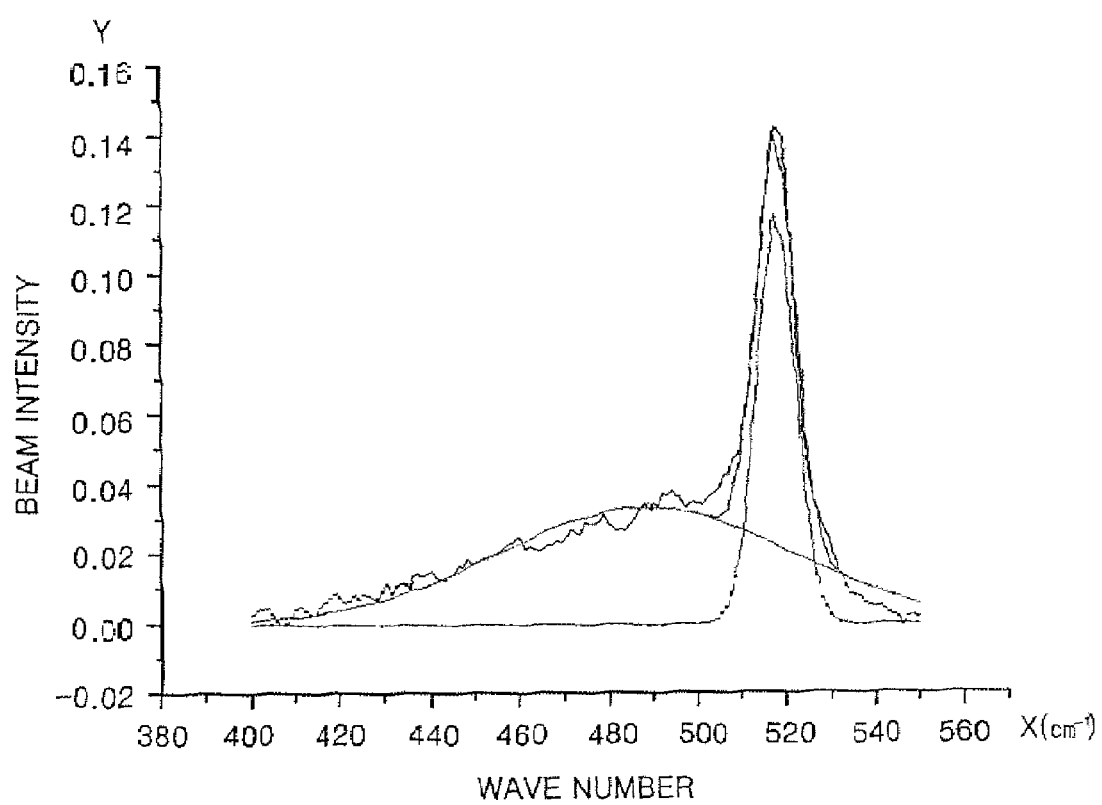
FIGS. 3B to 3D are Raman graphs showing a difference of crystallinity depending on a position in a grain.
Figure 3C:
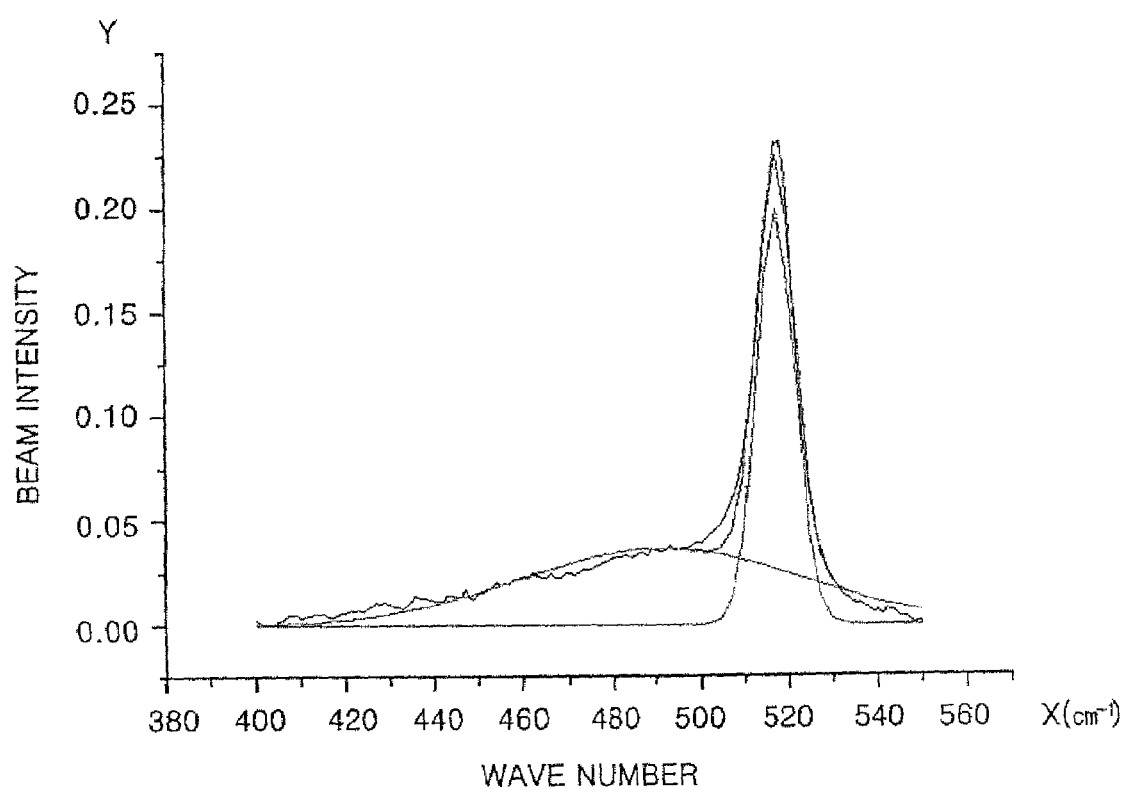
Figure 3D:
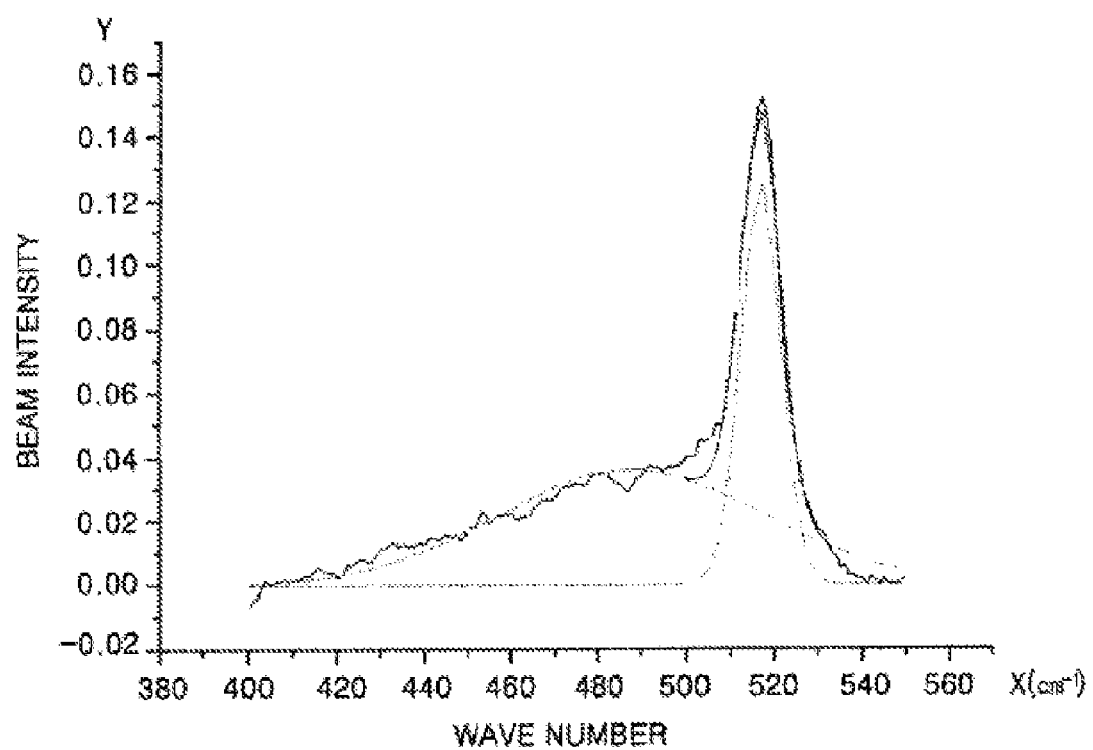

FIGS. 3B to 3D are Raman graphs showing a difference of crystallinity depending on a position of in a grain. The X-axis represents a wave number ($cm^{-1}$) and the Y-axis represents beam intensity. The term "crystallinity" refers to the relative ratio of beam intensity of a crystalline component to beam intensity of an amorphous component. In the Raman graph, the smooth region represents the amorphous component and the peak represents the crystalline component.

Referring to FIG. 3B, it may be appreciated that crystallinity at the grain center is 0.45. In other words, the amorphous component is more than the crystalline component, which indicates significantly low crystallization.

Referring to FIG. 3D, it may be appreciated that the crystallinity at the grain boundary is 0.52. In other words, the crystallinity is slightly larger than that for the grain center. However, it also indicates low crystallization.

Referring to FIG. 3C, it may be appreciated that the crystallinity at the space between the grain center and the grain boundary is 0.74. In other words, the crystallinity is significantly larger than those for the grain center and the grain boundary.

As described above, since the crystalline ratio may be changed according to the inner position in one grain, the uniformity of the characteristics of the thin film transistor depends on where the channel layer is formed. According to the present invention, the channel layer may be formed in a region having good crystallinity by arranging the seed within 1 to 3 μm from the junction region 15.

FIGS. 4A to 4D are diagrams illustrating a method of fabricating a thin film transistor according to a first embodiment of the present invention.

Figure 4A:
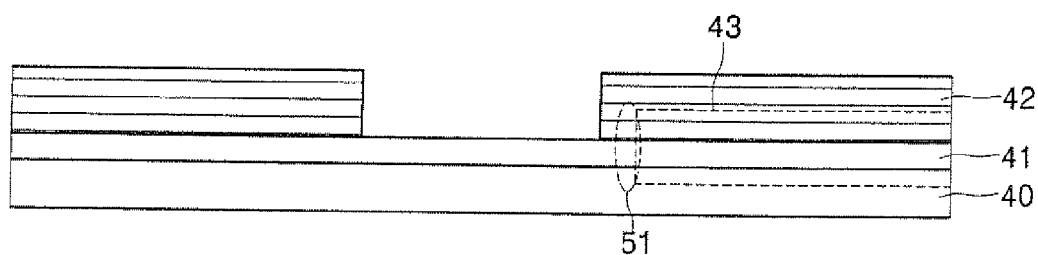
FIGS. 4A to 4D are diagrams illustrating a method of fabricating a thin film transistor according to a first embodiment of the present invention.

Referring to FIG. 4A, an amorphous silicon layer 41 is deposited on a substrate 40. A buffer layer 40a may be formed on the substrate 10, as shown in FIG. 4D. The amorphous silicon layer 41 may be formed by a plasma enhanced chemical vapor deposition (PECVD) method.

A first capping layer is formed on the amorphous silicon layer 41. The first capping layer may be made of a silicon nitride layer or a silicon oxide layer. In addition, the first capping layer may be formed by a PECVD method. Next, the first capping layer is patterned to form a first capping layer pattern 42. Here, the first capping layer is patterned such that a seed or a grain boundary described below is not formed in a junction region 51. Specifically, the junction region 51 where a channel formation region 43 and source and drain regions described below are met is covered with the first capping layer pattern 42, and then the first capping layer is patterned such that the seed created by the diffusion of a metal catalyst described below is not formed in the junction region 51. As a result, the seed or the grain boundary is formed in the semiconductor layer pattern, which will be described later, but not in the junction region 51. The seed or the grain boundary in the semiconductor layer pattern may exist in an active region of the semiconductor layer pattern. In addition, a width of the first capping layer pattern is adjusted such that the grain boundary is not formed in the junction region 51. The phrase "width of the first capping layer" refers to a width of the first capping layer not patterned. Therefore, the trap generation in the junction region 51 may be prevented.

The first capping layer pattern 42 causes the metal catalyst 45 not to diffuse by increasing the width or the density of a silicon nitride layer or a silicon oxide layer. In other words, the first capping layer pattern 42 serves as a metal catalyst non-diffusible layer.

Figure 4B:
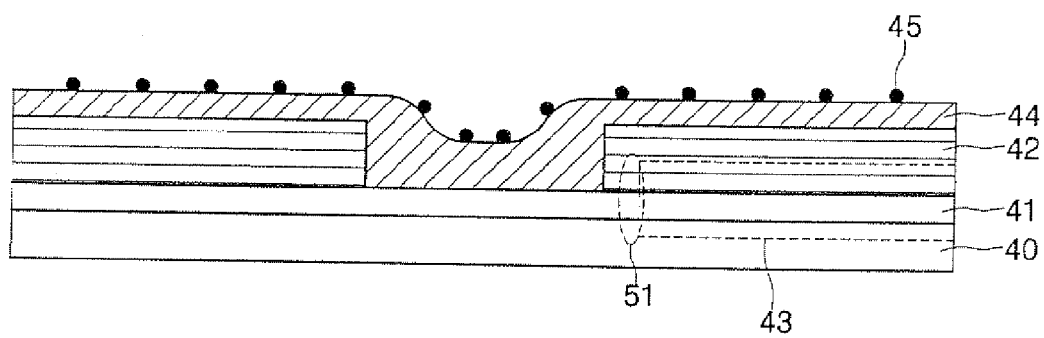

Referring to FIG. 4B, a second capping layer 44 is formed on the first capping layer pattern 42. The second capping layer 44 may be made of a silicon nitride layer or a silicon oxide layer. The second capping layer 44 may be formed to have a smaller thickness or a lower density than the first capping layer 42, thereby allowing the metal catalyst 45 to diffuse. In other words, the second capping layer 44 acts as a metal catalyst diffusible layer. In general, since an oxide layer or a nitride layer acts as a barrier for impurity diffusion, it is possible to prevent the metal catalyst 45 from diffusing by increasing the density of the silicon oxide layer or the silicon nitride layer. On the contrary, when the density of the silicon oxide layer or the silicon nitride layer is low, the metal catalyst 45 easily diffuses.

Next, a metal catalyst layer 45 is formed on the second capping layer 44. The metal catalyst 45 is preferably formed of nickel (Ni). The metal catalyst layer 45 may be formed by a sputtering method. In addition, the metal catalyst layer 45 may be formed using ion implantation or plasma. The method of using plasma includes arranging a metal material on the second capping layer 44, and exposing the resultant to the plasma to form the metal catalyst layer 45.

Figure 4C:
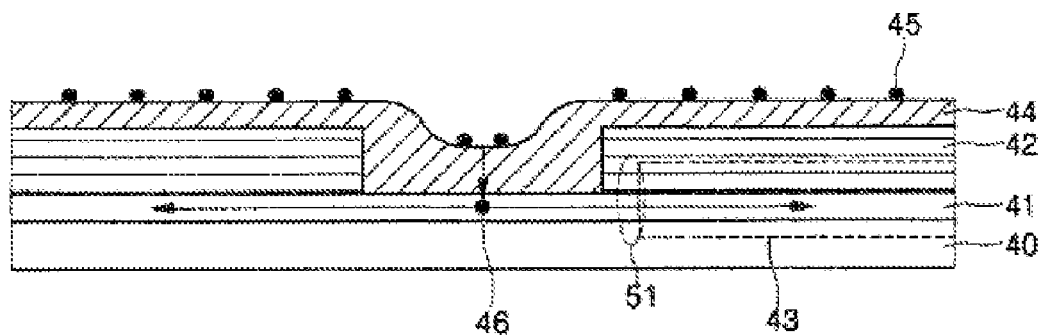
Figure 4D:
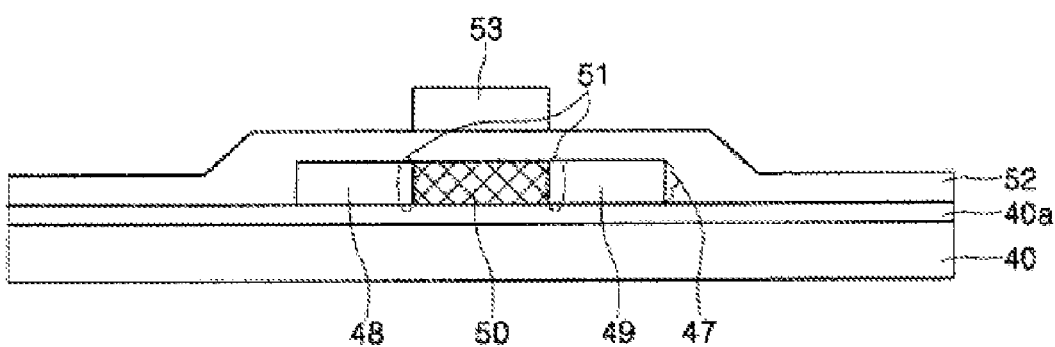

Referring to FIG. 4C, the metal catalyst 45 is subjected to diffusion. The diffusion may be achieved by annealing, i.e., performing heat treatment at a temperature of 200 to 700° C. for 1 hour. Through annealing, the metal catalyst 45 diffuses into the amorphous silicon layer 41 via the second capping layer 44. The diffused metal catalyst 45 forms a seed 46 in the amorphous silicon layer 41. The seed 46 refers to metal silicide formed when a metal catalyst reacts with silicon. The seed 46 is formed in the semiconductor layer pattern, which will be described later, other than the junction region 51. As shown in FIGS. 3A to 3C, the seed 46 is preferably formed within 1 to 3 μm in a contact hole direction in the junction region 51. The crystallization described below is performed with the seed 46. In general, only ¹⁄₁₀₀ of the metal catalyst 45 diffuses to form the seed 46. The metal catalyst not diffused due to the first capping layer pattern 42 is left on the second capping layer 44.

Next, the amorphous silicon layer 41 is crystallized to form a polysilicon layer. The crystallization may be performed by an annealing process, which heats for a long time in a furnace. Here, the crystallization is preferably performed at a temperature of 400 to 1000° C. When the annealing process is performed at the above temperature, the seed 46 laterally grows and comes in contact with an adjacent grain to form a grain boundary. Finally, the perfect crystallization may be performed. The grain of the polysilicon layer 36 formed by the crystallization method reaches 20 to 200 μm, or 300 μm in diameter.

Referring to FIG. 4D, after crystallization, the first capping layer pattern 42, the second capping layer 44, and the metal catalyst 45 are removed by an etching process. By removing the structures, the crystallized polysilicon layer may be prevented from unnecessary metal contaminant.

Next, the polysilicon layer is patterned and source and drain regions 48 and 49 and a channel layer 50 are formed by an ion implantation process. In other words, a semiconductor layer pattern 47 is formed. After forming a gate insulating layer 52 on the semiconductor layer pattern 47, a metal layer and a photoresist layer are sequentially deposited on the gate insulating layer 52. Next, the photoresist layer is patterned, and then the metal layer is etched using the patterned photoresist layer as a mask to form a gate electrode 53. Using the resultant, the thin film transistor may be finally obtained.

As can be seen from the foregoing, according to a thin film transistor and method of fabricating the same of the present invention, a first capping layer is patterned and crystallized such that a seed or a grain boundary is not formed in a junction region. Therefore, trap generation may be prevented in the junction region, so that the device characteristics of the thin film transistor may be improved and more uniform.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A method of fabricating a thin film transistor, comprising:
   forming an amorphous silicon layer on a substrate;
   crystallizing and patterning the amorphous silicon layer to form a semiconductor layer pattern, the semiconductor layer pattern comprising a source region, a drain region, and a channel;
   forming a gate insulating layer on the semiconductor layer pattern; and
   forming a gate electrode on the gate insulating layer,
   wherein a seed or a grain boundary exists in the semiconductor layer pattern but a junction region in the semiconductor layer pattern wherein the source region and the channel meet and the drain region and the channel meet does not have a grain boundary.

2. The method according to claim 1, wherein the seed or the grain boundary in the semiconductor layer pattern exists in an active region of the semiconductor layer pattern.

3. The method according to claim 1, wherein forming the semiconductor layer pattern comprises:
- forming and patterning a first capping layer on the amorphous silicon layer;
- forming a second capping layer on the first capping layer pattern;
- forming a metal catalyst layer on the second capping layer;
- diffusing the metal catalyst; and
- crystallizing the amorphous silicon layer to form a polysilicon layer.

4. The method according to claim 3, wherein the first capping layer is patterned such that the seed is formed within 1 to 3 μm from the junction region in a direction of a contact hole.

5. The method according to claim 3, wherein the first capping layer pattern is formed of any one of a silicon nitride layer and a silicon oxide layer.

6. The method according to claim 3, wherein the second capping layer is formed of any one of a silicon nitride layer and a silicon oxide layer.

7. The method according to claim 3, wherein the first capping layer pattern is thicker than the second capping layer.

8. The method according to claim 3, wherein the first capping layer pattern has a higher density than the second capping layer.

9. The method according to claim 3, wherein the first capping layer and the second capping layer are formed by a plasma enhanced chemical vapor deposition (PECVD) method.

10. The method according to claim 3, wherein the metal catalyst is formed of nickel (Ni).

11. The method according to claim 3, wherein the metal catalyst layer is formed by any one of a chemical vapor deposition (CVD) method and a sputtering method.

12. The method according to claim 3, wherein the diffusion of the metal catalyst is performed by an annealing process.

13. The method according to claim 12, wherein the annealing process is performed at a temperature of 200 to 700° C.

14. The method according to claim 3, wherein the amorphous silicon layer is crystallized by an annealing process.

15. The method according to claim 14, wherein the annealing process is performed at a temperature of 400 to 1000° C.

16. The method according to claim 1, further comprising forming a buffer layer between the substrate and the amorphous silicon layer.

* * * * *